(12) United States Patent
Yamazaki et al.

(10) Patent No.: US 8,487,253 B2
(45) Date of Patent: *Jul. 16, 2013

(54) SCANNING ELECTRON MICROSCOPE

(75) Inventors: Minoru Yamazaki, Hitachinaka (JP); Akira Ikegami, Suita (JP); Hideyuki Kazumi, Hitachinaka (JP); Manabu Yano, Hitachiomiya (JP); Kazunari Asao, Tokai (JP); Takeshi Mizuno, Hitachi (JP); Yuki Ojima, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/300,117

(22) Filed: Nov. 18, 2011

(65) Prior Publication Data

US 2012/0061566 A1  Mar. 15, 2012

Related U.S. Application Data

(63) Continuation of application No. 12/392,563, filed on Feb. 25, 2009, now Pat. No. 8,080,790.

(30) Foreign Application Priority Data

Mar. 5, 2008 (JP) ................................. 2008-054227
Mar. 5, 2008 (JP) ................................. 2008-054229

(51) Int. Cl.
*H01J 37/29* (2006.01)
*G21K 5/04* (2006.01)

(52) U.S. Cl.
USPC ........ 250/311; 250/306; 250/310; 250/396 R; 250/397

(58) Field of Classification Search
USPC ............. 250/306, 307, 309, 310, 311, 396 R, 250/397

See application file for complete search history.

(56) References Cited

U.S. PATENT DOCUMENTS 6,107,637 A   8/2000   Watanabe et al.
6,521,891 B1  2/2003   Dotan et al.
(Continued)

FOREIGN PATENT DOCUMENTS

JP   11-149895    6/1999
JP   2001-236915  8/2001
(Continued)

OTHER PUBLICATIONS

Entire Prosecution of U.S. Appl. No. 12/392,563 to Minoru Yamazaki et al., filed Feb. 25, 2009, entitled, "Scanning Electron Microscope."

*Primary Examiner* — Nicole Ippolito
(74) *Attorney, Agent, or Firm* — McDermott Will & Emery LLP

(57) ABSTRACT

An object of the present invention is to provide a scanning electron microscope suitable for monitoring apparatus conditions of the microscope itself, irrespective of the presence of charge-up, specimen inclination, and the like. In order to achieve the object, proposed is a scanning electron microscope including a function to monitor the apparatus conditions on the basis of information obtained with an electron beam reflected before reaching a specimen. Specifically, for example, while applying a negative voltage to the specimen to reflect the electron beam before the electron beam reaches the specimen, and simultaneously supplying a predetermined signal to a deflector for alignment, the scanning electron microscope monitors changes of the detected positions of the reflected electrons of the electron beam. If the above-mentioned predetermined signal is under the condition where an alignment is properly performed, the changes of the detected positions of the electrons reflect deviation of an axis.

6 Claims, 14 Drawing Sheets

U.S. PATENT DOCUMENTS

| | | |
|---|---|---|
| 6,633,034 B1 | 10/2003 | Crewe |
| 6,688,487 B2 | 2/2004 | Oakes et al. |
| 6,946,656 B2 | 9/2005 | Ezumi et al. |
| 8,080,790 B2 * | 12/2011 | Yamazaki et al. ............ 250/311 |
| 2006/0011835 A1 * | 1/2006 | Murakoshi et al. ........... 250/310 |
| 2007/0120065 A1 | 5/2007 | Takane et al. |
| 2008/0191135 A1 | 8/2008 | Aoki et al. |
| 2009/0261252 A1 | 10/2009 | Hasegawa et al. |
| 2010/0213370 A1 * | 8/2010 | Nakasuji et al. .............. 250/310 |

FOREIGN PATENT DOCUMENTS

| | | |
|---|---|---|
| JP | 2005-276639 | 10/2005 |
| JP | 2005-338096 | 12/2005 |
| JP | 2007-141632 | 6/2007 |

* cited by examiner

Ic; Condensing lens set value
Bm; The number of detected mirror electrons (a)

(b)

(c)

SCANNING ELECTRON MICROSCOPE

RELATED APPLICATIONS

This application is a Continuation of U.S. application Ser. No. 12/392,563, filed on Feb. 25, 2009 now U.S. Pat. No. 8,080,790, claiming priority of Japanese Patent Application Nos. 2008-054227 and 2008-054229, both filed on Mar. 5, 2008, the entire contents of each of which are hereby incorporated by reference.

BACKGROUND OF THE INVENTION

The present invention relates to an electron microscope that measures, inspects or observes a specimen by use of an electron beam, and particularly, relates to a scanning electron microscope provided with a function to make an axis adjustment of an electron beam, or a scanning electron microscope suitable for measurement of a height or charge-up of a specimen.

Size reduction and high integration of semiconductor devices have been rapidly advanced, and length measurement and inspection techniques have increasingly become more important these days. Scanning electron microscopes are an apparatus that observes a surface of a specimen by scanning the specimen with a focused electron beam and detecting secondary electrons or reflected electrons. Providing high resolution, the scanning electron microscopes are widely used as semiconductor length measurement and inspection apparatuses which are represented by a CD-SEM (Critical Dimension-Scanning Electron Microscope), a DR-SEM (Defect Review-Scanning Electron Microscope), or the like.

In order to observe the specimen with high resolution using such an apparatus, the conditions for the apparatus need to be adjusted as appropriate. For example, when a trajectory of an electron beam is deviated from the center of an objective lens, aberration is generated and thus image quality deteriorates. To avoid this, optical axis adjustment needs to be made before observation. Resolutions of respective apparatuses vary due to a difference among the apparatuses, i.e., a so-called machine difference, which poses a problem in improving measurement repeatability between the apparatuses. The conventional techniques for diagnosing and adjusting the apparatus conditions include following methods.

Patent document 1 discloses a method in which: a particular point such as an end of a knife edge or a center point of a cross mark is firstly measured at multiple focus levels; and the position of an objective lens aperture is automatically adjusted so that the specific points measured at the respective focus levels overlap each other.

Patent document 2 proposes a charged particle beam device which makes a focus evaluation or a focus adjustment before changing the deflecting conditions of an alignment deflector; or which is provided with a table of an amount of the focus adjustment corresponding to the deflecting conditions of the alignment deflector, and makes the focus adjustment in accordance with the table after changing the deflection conditions of the alignment deflector.

The above-mentioned semiconductor inspection and measurement apparatuses are designed to be installed in a semiconductor production line and to operate without human intervention. Moreover, for a speedup in inspection and length measurement, it is necessary to reduce each processing time and to capture a clear image at a high speed without focus deviation.

Generally, a focus adjustment is made by using a method of performing an automatic focus adjustment on the basis of SEM images captured at different focus planes. However, the method requires time, and thus throughput decreases. In order to reduce the time required for a focus adjustment, Patent document 3 discloses a method of focusing according to a wafer surface height by detecting the surface height with an optical height detector. Furthermore, patent document 4 discloses a method of making an adjustment to correct focus deviation caused by charge-up. In this method, the charge-up voltage is measured with an electrostatic potentiometer before actual measurement, and a focus adjustment is made on the basis of the measured voltage and the height of the specimen measured with an optical height detector.

In addition, patent document 5 discloses a technique in which: scores of images obtained by using different beam energies are analyzed; and the focus adjustment is made by adjusting the beam energy in accordance with this analysis.

Patent document 1: Japanese Patent Application Publication No. 2005-276639

Patent document 2: Japanese Patent Application Publication No. 2007-141632 (corresponding to US2007/0120065)

Patent document 3: Japanese Patent Application Publication No. 11-149895 (corresponding to U.S. Pat. No. 6,107,637)

Patent document 4: Japanese Patent Application Publication No. 2005-338096 (corresponding to U.S. Pat. No. 6,946,656)

Patent document 5: Japanese Patent Application Publication No. 2001-236915 (corresponding to U.S. Pat. No. 6,521,891)

SUMMARY OF THE INVENTION

Patent document 1 and patent document 2 describe the examples in which an axis adjustment (hereinafter, may be referred to as an alignment) is made using images captured by a scanning electron microscope. However, if the specimen is charged up due to electron beam scanning at the time of acquiring the image, the electron beam is bent. For this reason, an alignment may not be performed properly. Moreover, some of semiconductor specimens such as wafers have their surfaces inclined. Image changes generated by such inclination, charge-up or the like of the specimen make it difficult to determine which one of factors such as the inclination and charge-up causes deviation of the axis. As a result, a proper alignment is difficult in some cases.

This description proposes later on a scanning electron microscope aiming at monitoring apparatus conditions of the microscope itself, irrespective of the presence of charge-up, inclination or the like of a specimen, and proposes, as one example of a specific aspect of such microscope, a scanning electron microscope capable of performing a proper alignment on the basis of the monitored result.

The technique disclosed in patent document 3 has a problem when a transparent specimen is observed. More specifically, in such a case, the lens may not be focused on the specimen because the height of the specimen measured with the optical height detector is different from the actual height of the specimen. The technique also has another problem that even when the height of the specimen is accurately measured, the electron beam is accelerated (or decelerated) by charge-up, so that the focus deviates. In the technique disclosed, as a method of adjusting the focus to correct focus deviation caused by the charge-up, in patent document 4, the charge-up voltage is measured with an electrostatic potentiometer before actual measurement. Measurement of the voltage before actual measurement is a very effective method from a viewpoint of throughput. However, in the case where the charge-up voltage changes over time or in a similar case, a focus adjustment requires little bit more time than that in the case where the voltage does not change at all.

In the technique disclosed in patent document 5, the scores of the images obtained using the different beam energies are analyzed, and a focus adjustment is made by adjusting the beam energy in accordance with this analysis. However, since the images are obtained through the electron beam irradiation of the specimen, a damage or charge accumulation of the specimen may be caused due to the electron beam irradiation, and the throughput may be reduced due to delay in the focus adjustment.

This description proposes below a scanning electron microscope aiming at accurately measuring the potential or the height of a specimen while suppressing a damage or the like of the specimen caused by irradiation with the electron beam.

In order to achieve the above-mentioned aims, hereinafter, proposed is a scanning electron microscope provided with a function to monitor apparatus conditions of the microscope itself, on the basis of information obtained in a state where an electron beam is prevented from reaching the specimen. More specifically, for example, while applying a negative voltage to the specimen to reflect the electron beam before the electron beam reaches the specimen and simultaneously supplying a predetermined signal to a deflector for alignment, the microscope monitors changes of the detected positions of the above-mentioned reflected electrons obtained. If the predetermined signal is under the condition where an alignment is properly performed, changes of the detected positions of the above-mentioned electrons reflect deviation of the axis. Since the electron beam is prevented from reaching the specimen at this time, it is possible to monitor deviation of the axis while suppressing the charge-up caused by the electron beam irradiation.

With the above-mentioned configuration, it is possible to monitor the apparatus conditions in the state where the electron beam is prevented from reaching the specimen, and to highly precisely set the apparatus conditions.

Furthermore, in order to attain the other aim mentioned above, proposed is a scanning electron microscope that measures the height and the potential of a specimen by using a detection result of charged particles such as the electrons obtained by irradiating the specimen with a charged particle beam such as an electron beam, or the like while applying a voltage to the specimen in order to prevent the charged particle beam from reaching the specimen. Moreover, in one aspect thereof proposed herein, the scanning electron microscope corrects the apparatus conditions (for example, magnification, focus, observation coordinate, and the like) on the basis of the measured height and potential of the specimen, since the apparatus conditions change due to the charge-up of the specimen.

With the above-mentioned configuration, the height or the potential of the specimen can be measured while the electron beam is prevented from reaching the specimen. Accordingly, it is possible to adjust the apparatus conditions with high precision without allowing the apparatus conditions to change due to a damage or charge accumulation of a specimen that might be otherwise caused by the electron beam irradiation.

DETAILED DESCRIPTION OF THE PREFERRED EMBODIMENTS

Embodiment 1

Hereinafter, description will be given of a method for accurately diagnosing apparatus conditions in distinction from a state of a specimen by using a reflected electron beam that is not in contact with the specimen, and given of an apparatus for implementing the method.

First, a measurement principle will be described. In a scanning electron microscope including: a lens including an electrode and a magnetic field, and focusing an electron beam by accelerating and decelerating the electron beam; an alignment deflector that performs axial correction; an objective lens; an aperture; and a stage that holds a specimen and applies a potential to the specimen, acceleration energy of electrons is defined as Ee, the potential applied to the specimen is defined as Vr, and |−Vr| is set so as to be larger than Ee.

Figure 2:
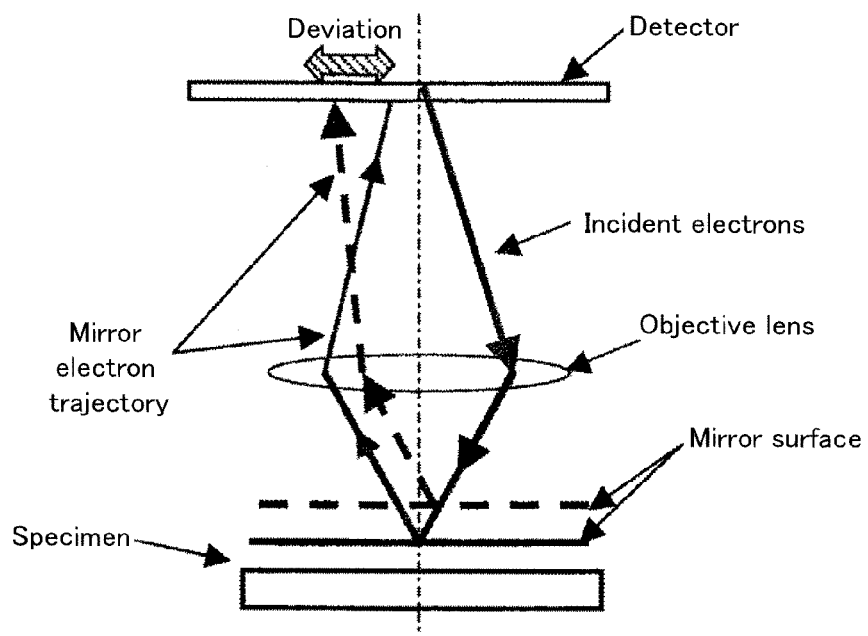
FIG. 2 is a diagram illustrating a trajectory of the mirror electrons.

When the electron beam is emitted to the specimen in this state, the incident electrons are reflected right above the specimen without entering the specimen, as shown in FIG. 2 (this state is referred to as a mirror state, the reflected electrons are referred to as a mirror electrons, and a virtual reflection plane is referred to as a mirror surface). The reflected mirror electrons travel within the lens system in a reverse direction. When a detector is disposed in the lens system, the detector can detects arrival positions (Xm, Ym, Zm) of the mirror electrons. Here, for example, when a Vr setting value is changed to change mirror surface position, deviation of the mirror electron arrival position corresponding to the amount of the position change can be detected.

Figure 3:
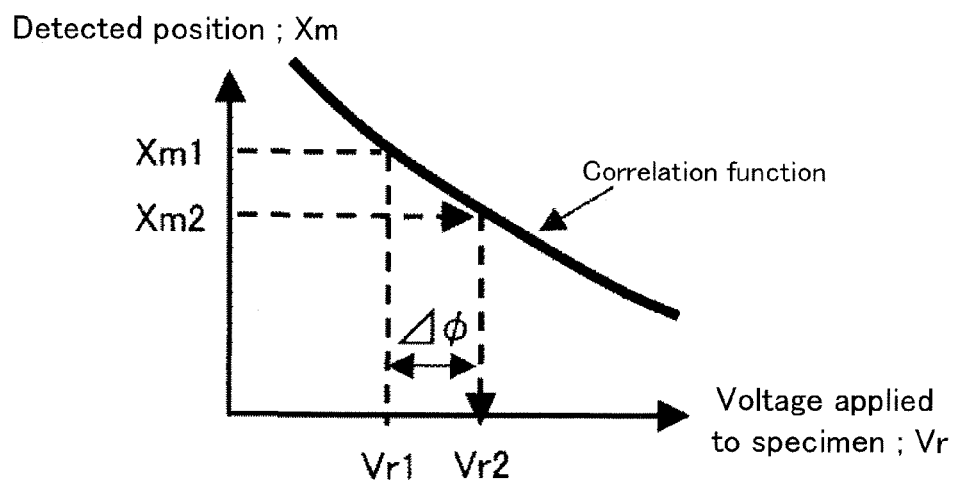
FIG. 3 is a diagram illustrating a method of calculating the potential of the specimen based on the trajectory of the mirror electrons.

A charge-up voltage of the specimen can be determined from this amount of deviation. For example, by maintaining multiple data groups of Xm when changing Vr, a correlation function in which an abscissa shows Vr and an ordinate shows Xm can be created as shown in FIG. 3. If the specimen is charged up at this time, the position of the mirror surface varies corresponding to the charge-up amount. Accordingly, even when Vr is set to Vr1, the arrival position of the mirror electrons deviates from Xm1 to Xm2 or the like. A value of Vr estimated from Xm2 and the correlation function is Vr2. Since Vr2 reflects the position of the mirror surface, Vr2 shows the potential of the charged specimen surface. Namely, the charge-up amount Ay can be calculated from Vr2−Vr1. Here, Ym, Zm and the like can also be used in place of Xm, for the correlation function.

In the description below, the above-mentioned method is applied and a method for diagnosing an apparatus will be provided, in which each of setting parameters (alignment deflector setting value, condensing lens setting value, deflecting coil setting value, and the like) is defined as a variable in place of Vr, and change in conditions (position deviation of apparatus configuration components, electrode and magnetic field lens, axial correction amount, magnification, and the like) of the apparatus is calculated using a correlation function acquired under reference conditions. For example, deviation of the axis of the beam from the objective lens can be calculated in the following manner.

Figure 4:
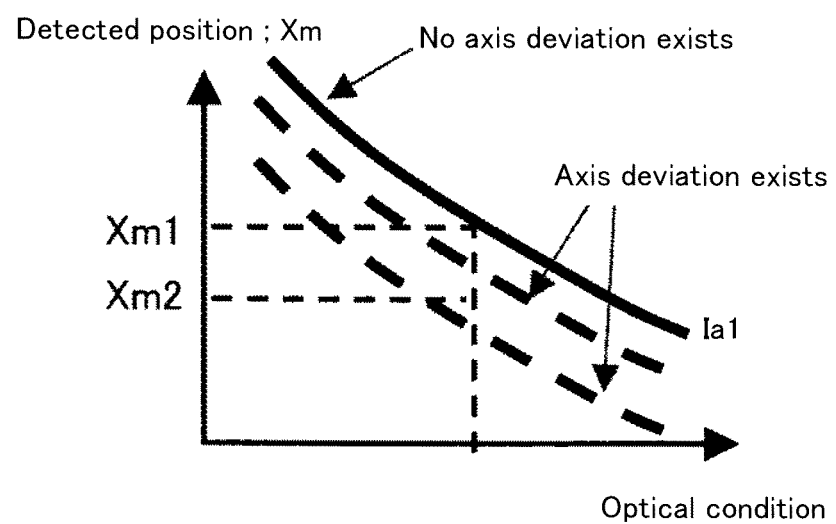
FIG. 4 is a diagram illustrating a method of calculating, based on the trajectory of the mirror electrons, deviation of an axis of an electron beam from an objective lens.

The setting value of the alignment deflector is defined as Ia. In the reference conditions in which an axis adjustment is made (in a state where a current Ia1 is supplied to the alignment deflector) as shown in FIG. 4, the arrival position (Xm, Ym, Zm) of the mirror electron is acquired under each of different optical conditions of an optical element (for example, voltage Vr applied to the specimen, current $I_{obj}$ supplied to the objective lens (voltage Vobj when the objective lens is an electrostatic lens), and the like). Then, a correlation curve between the arrival positions and the optical conditions is calculated.

Next, under the apparatus conditions in which the axis of the beam is deviated, the above-mentioned Ia is varied in order to calculate the above-mentioned correlation function. The correlation function is calculated for each of the different Ias. In this state, when a current value of the alignment deflector is set to a predetermined value of Ia1 at the time of diagnosis, the detected position of the mirror electron in a state of having no axis deviation is Xm1 because the position agrees with the correlation function under the reference conditions.

When the axis is deviated, the detected position of the mirror electron is, for example, Xm2, and this position agrees with a different correlation function. Here, the deviation amount of the axis at the time of diagnosis can be estimated using the amount of axis deviation corresponding to the agreed correlation function. Alternatively, when there is no agreed correlation function, the deviation amount of the axis can be estimated, for example, with the interpolation between two correlation functions which are adjacent to the detected position.

If a table showing a relationship between the deviation amount of the beam axis and an Ia appropriate value is prepared in advance, Ia can be easily corrected using the estimated deviation amount of the beam axis. As a variable of the correlation function, Vb, Io, or the like can be also used in place of Ia. The present method is also applicable to determination of a deviation direction of the beam axis as well as the deviation amount of the beam axis.

Hereinafter, using the drawings, more detailed description will be further given of a method of monitoring the apparatus conditions by use of the mirror electrons.

Figure 1:
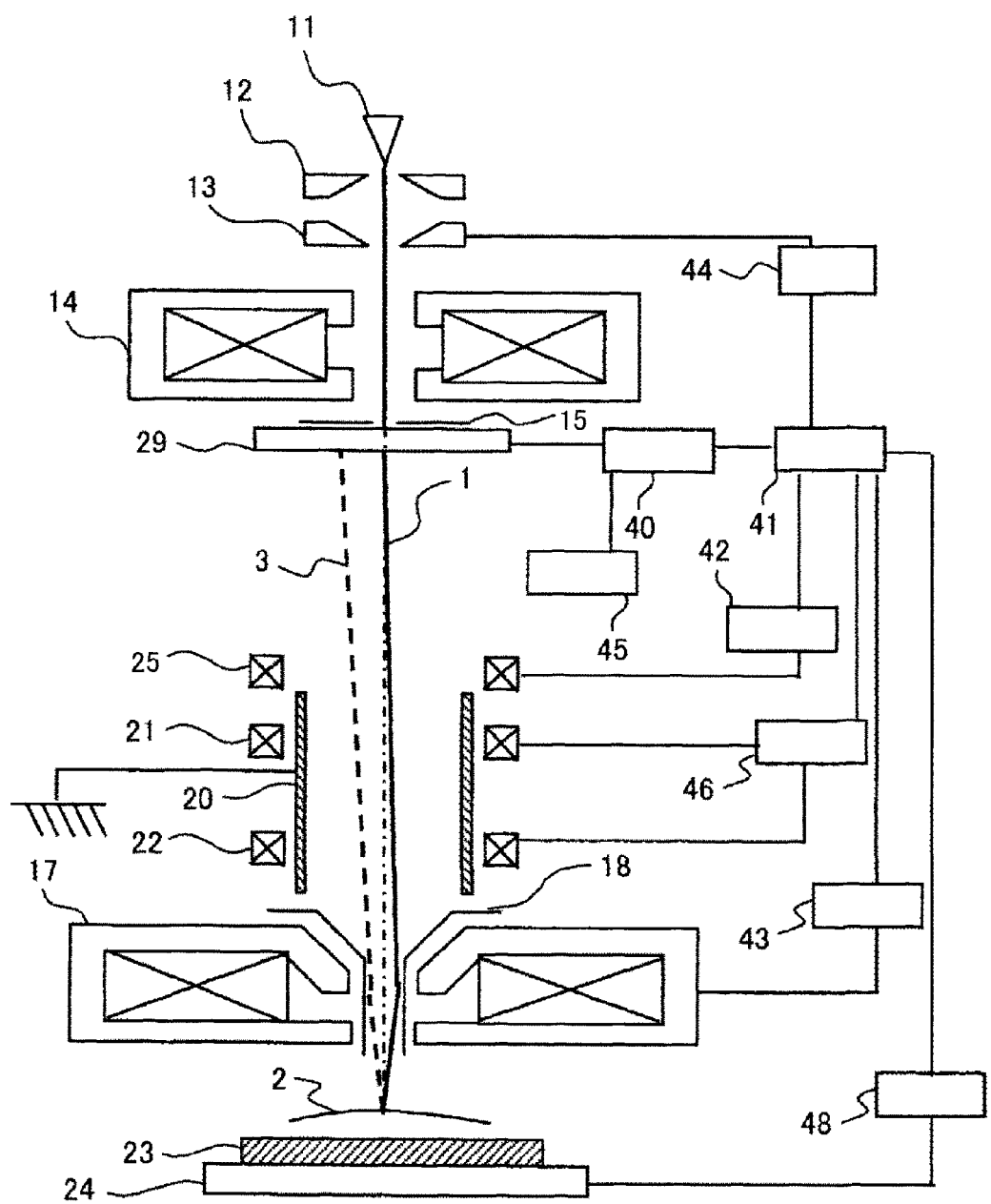
FIG. 1 is a diagram illustrating a scanning electron microscope for performing a potential measurement method by use of mirror electrons.

FIG. 1 shows a method for diagnosing an apparatus by use of the mirror electrons, and an example of an electron microscope on which the apparatus is mounted. A primary electron beam 1 is extracted by applying an extraction voltage between a field emission electrode 11 and an extraction electrode 12. The extracted primary electron beam 1 is accelerated by an acceleration voltage that an acceleration voltage control system 44 applies to an accelerating electrode 13. The primary electron beam 1 is subjected to scanning deflection by a condensing lens 14, an upper deflector 21, and a lower deflector 22. Deflection intensity of the upper deflector 21 and that of the lower deflector 22 are adjusted so that two-dimensional scanning on a specimen 23 may be performed with a lens center of an objective lens 17 serving as a fulcrum. The deflected primary electron beam 1 is accelerated by an acceleration cylinder 18 provided in a path of the objective lens 17. The accelerated primary electron beam 1 is focused by lens action of the objective lens 17. A stage voltage control system 48 applies a potential Vr to the specimen (or specimen stage (also, referred to as a specimen stand) 24), the potential Vr being sufficiently larger than acceleration energy Ee of the electrons.

For example, when Ee is 2 keV, a potential Vr larger than approximately −2000 V is applied. Thereby, an equipotential surface (mirror surface 2) of −2000 V in potential is obtained in a position above the specimen. The primary electron beam is reflected here, and returns upwards. This electron will be referred to as a mirror electron 3. The mirror electron 3, which has passed through the lens system, reaches a detector 29. The detector 29 detects a position (Xm, Ym, Zm) of the mirror electron 3. A storage unit 45 is a storage unit that records this information on (Xm, Ym, Zm). A computing element 40 calculates an amount of 'deviation' from the information on (Xm, Ym, Zm) on several conditions recorded in the storage unit 45, and thus calculates an amount of changes in apparatus conditions on the basis of this amount of 'deviation.' This information is sent to an analyzer 41, so that the analyzer 41 controls the apparatus conditions therein and sets signals of parameters of a control system. The control system includes, for example, an alignment deflector control system 42, an objective lens control system 43, a deflector control system 46, and the like, which control the apparatus conditions. A guide 20 is disposed and installed so as to surround a trajectory of the primary electron beam 1.

Figure 5:
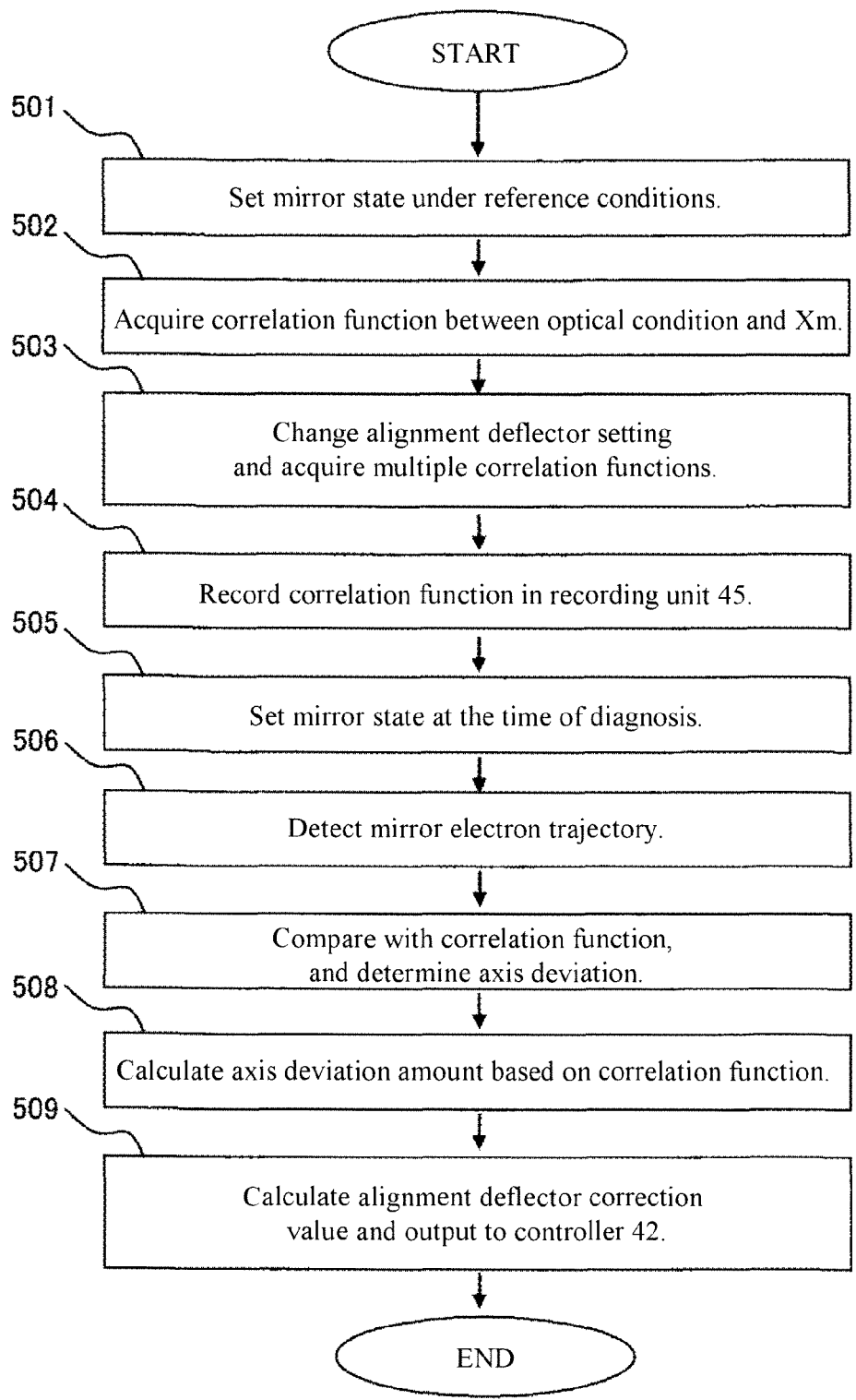
FIG. 5 is a schematic flow to calculate, based on the trajectory of the mirror electrons, deviation of the axis of the electron beam from the objective lens.

FIG. 5 is a schematic flow that shows an example of a method for calculating deviation of the beam from the objective lens center at the time of diagnosis based on deviation of the mirror electron trajectory. A setting value of an alignment deflector 25 is defined as Ia, and the detected position of the mirror electron is defined as (Xm, Ym, Zm). In 501, the apparatus is adjusted to the reference conditions, and is set to a mirror state. The setting value of the alignment deflector 25 at this time is defined as Ia1. In 502, Ia is changed, data on Xm (data on Ym or Zm may be used) is acquired, and the correlation curve between Ia and Xm is recorded in the storage unit 45. Here, more accurate correlation curve can be obtained as more data groups of Ia and Xm are recorded. Subsequently, in 503, setting of the alignment deflector 25 is changed in a way that the deviation amount of the beam axis is intentionally changed, and a correlation curve between Ia and Xm is acquired. Here, the multiple changed deviation amounts of the beam axis are acquired. The correlation function of the reference conditions and multiple correlation functions each having a different deviation amount of the beam axis are stored in the storage unit 45 in 504. At the time of diagnosis of the apparatus condition, in 505, the apparatus parameters are set to the same values as those of the reference conditions so that the mirror state is made, and the detected position of the mirror electrons is calculated in 506. In 507, the detected position of the mirror electrons is compared with the correlation function on the reference conditions stored in the storage unit 45. Then, it is determined that when the detected position is on the correlation curve, the beam is not deviated at the time of diagnosis, and when the detected position is not on the correlation curve, the beam is deviated. Alternatively, deviation of the beam from the reference conditions is determined by acquiring the correlation curve at the time of diagnosis and comparing that with the correlation curve on the reference conditions. In 508, in comparison with the multiple correlation functions stored, the deviation amount of the beam axis with which the correlation function at the time of diagnosis agrees is calculated in comparison with the stored correlation functions. If there is no data on an agreed correlation function, interpolation between any two correlation functions next to each other is made to estimate the deviation amount of the beam axis. In 509, reference is made to the table of appropriate setting values for the alignment deflector relative to the deviation amount of the beam axis prepared in advance, a correction amount of the setting value for the alignment deflector is calculated from calculated inclination of the beam, and the corrected setting value is outputted to the alignment deflector control system 42. This corrects deviation of the beam axis from the objective lens center.

Embodiment 2

Hereinafter, a second embodiment will be shown. Based on deviation of the mirror electron trajectory, position deviation from the aperture of the field emission electrode at the time of diagnosis is calculated. In the same manner as the above-mentioned embodiment, the potential applied to the specimen is set so as to be sufficiently larger than the acceleration energy Ee of the electrons, and a position Xt of the field emission electrode 11 can be adjusted. In this state, the number of detected mirror electrons where the setting value of the condensing lens is Ic1 is defined as Bm1. Since the mirror electron is not in contact with the specimen, Bm1 is equal to the number of electrons that have passed through the aperture. Where the setting value of the condensing lens is Ic2, the beam is emitted with the same energy, and the number Bm2 of the detected mirror electrons at this time is calculated from the detector. When multiple data groups of (Ic, Bm) are acquired, the correlation curve between Ic and Bm can be calculated from this data. The correlation curve between Ic and Bm is acquired on the reference conditions in which the position of the field emission electrode having its Xt adjusted does not deviate. If position deviation is generated in the field emission electrode, the number of the electrons passing through the aperture changes. Consequently, the correlation curve between Ic and Bm changes. Therefore, position deviation of the electrolytic emission electrode can be determined from this change in correlation curve. At this time, instead of Bm, a mirror electron detected position (Xm, Ym, Zm), and the like can be also used for obtaining the correlation curve.

Embodiment 3

Figure 6:
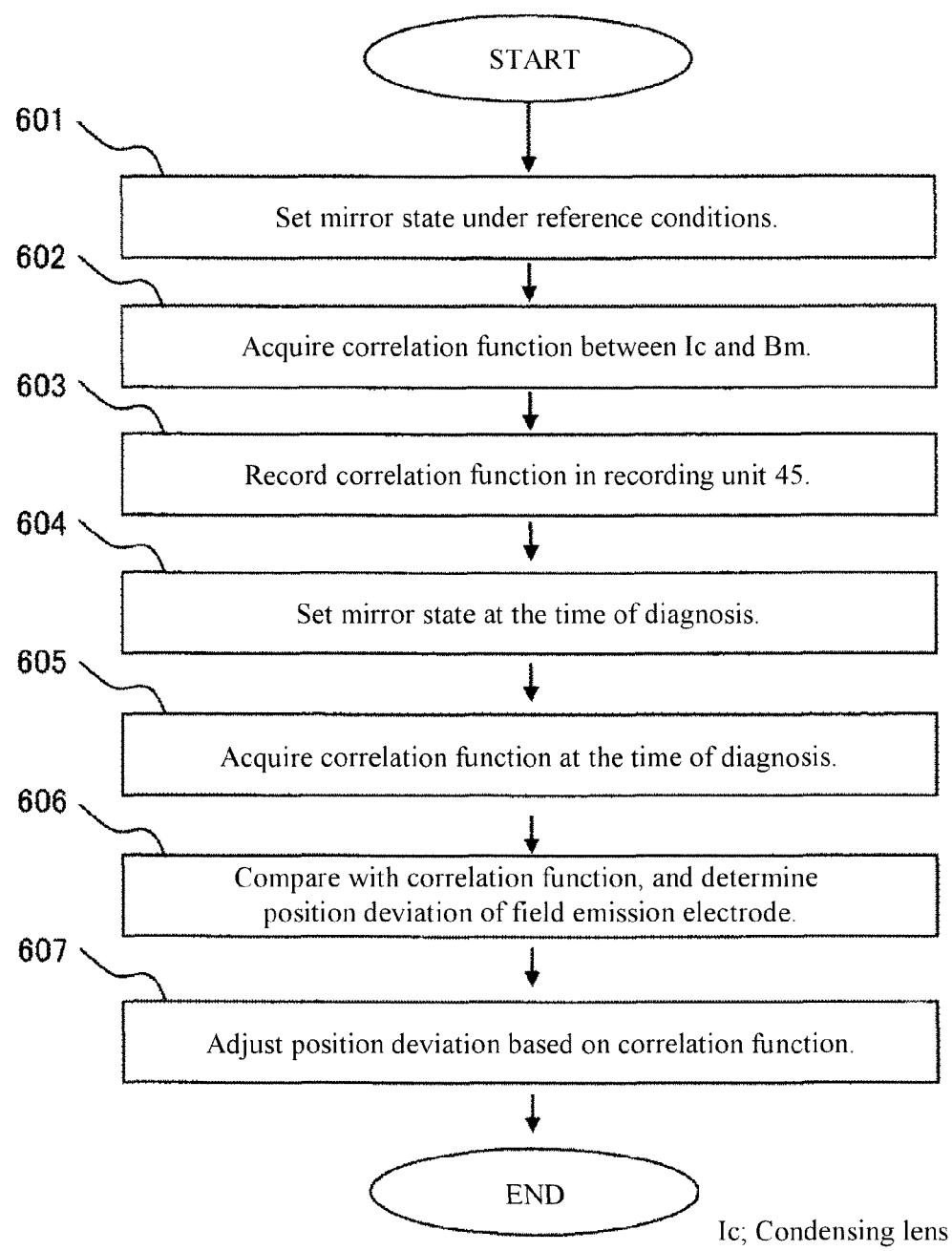
FIG. 6 is a schematic flow to calculate, based on luminance of the mirror electrons, deviation of a position of a field emission electrode from an aperture.

FIG. 6 is a schematic flowchart showing a third embodiment, which is an example of a method for diagnosing position deviation of an electron source. A setting value of the condensing lens is defined as Ic, and the number of the mirror electrons detected per unit time is defined as Bm. In the same manner as in the above-mentioned schematic flow, in 601, the apparatus is adjusted to the reference conditions, and is set to the mirror state. In 602, when Ic is changed, the number of the electrons that passes through the aperture changes. Accordingly, the correlation function between Ic and Bm can be acquired from data of Bm. In 603, the correlation curve between Ia and Bm is stored in the storage unit 45. Next, in 604, the mirror state is set at the time of diagnosis of the apparatus conditions. In 605, the correlation function between Ia and Bm is acquired in the same manner as in the case of the reference conditions. In 606, the correlation function with the reference conditions is compared with the correlation function at the time of diagnosis. If both the correlation functions agrees with each other, it is determined that there is no position deviation between the field emission electrode and the electrode, and when both do not agree, it is determined that position deviation has occurred. With the adjustment of Xt so that both the correlation functions may agree with each other in 607, it is possible to reproduce the state where there is no position deviation.

Embodiment 4

Figure 7:
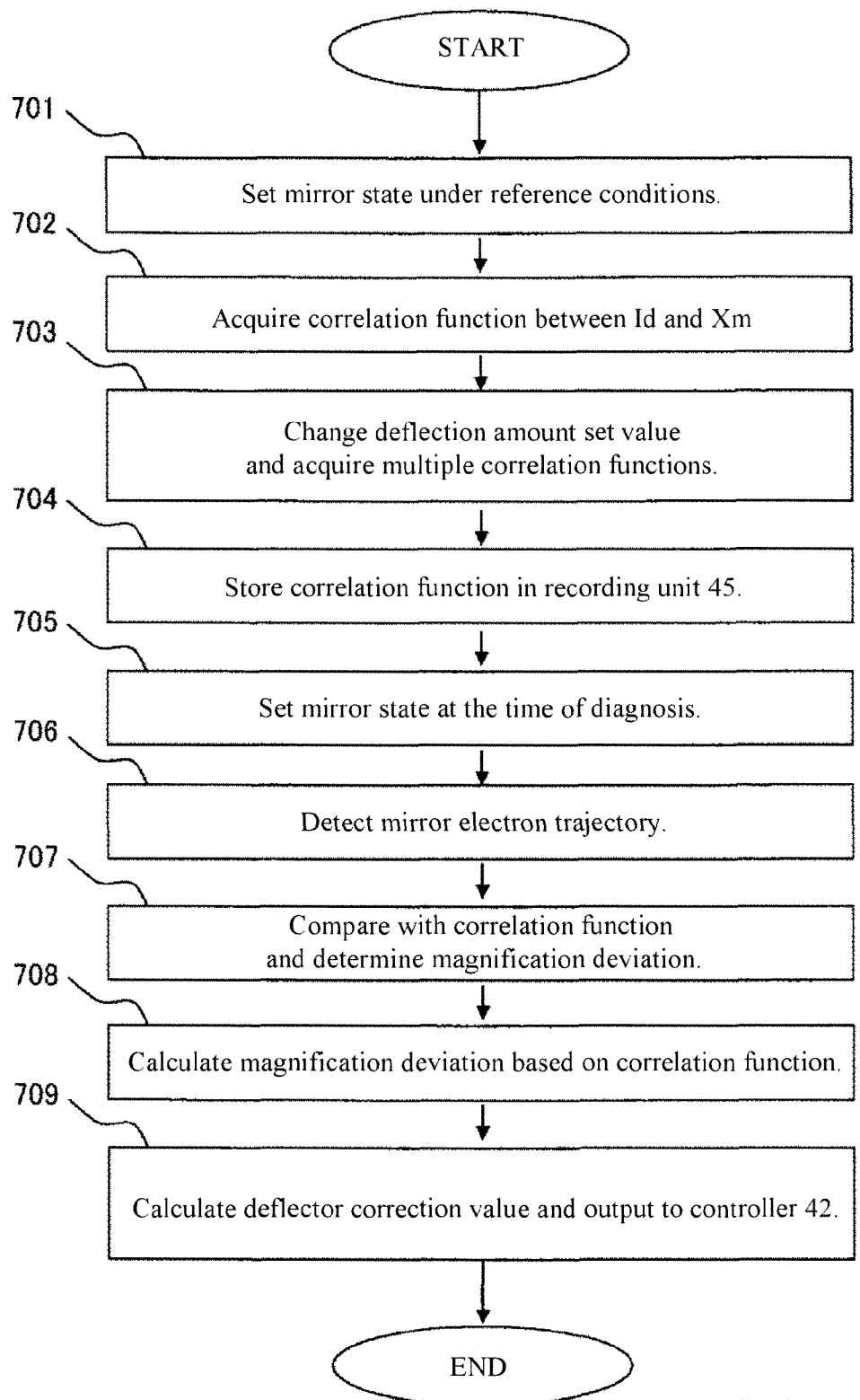
FIG. 7 is a schematic flow to calculate, based on the trajectory of the mirror electrons, deviation of a magnification.

FIG. 7 is a flowchart showing a fourth embodiment, which is an example of a method for diagnosing change in magnification by use of the mirror electrons. In the same way as the above-mentioned embodiment, in 701, the potential applied to the specimen is set to a value sufficiently larger than the acceleration energy Ee of the electrons, a deflection intensity ratio of the upper deflector 21 and the lower deflector 22 is adjusted to the reference conditions, and the detected position of the mirror electrons when a setting value of a deflection amount is Id is defined as (Xm, Ym, Zm). In 702, the correlation function of Id and Xm (or Ym, Zm) on the reference conditions is acquired. Multiple correlation functions each having Id changed are acquired in 703, and are stored in the storage unit 45 in 704. In 705, the mirror state is set at the time of diagnosis of the apparatus conditions, and the detected position of the mirror electron is acquired in 706. In 707, determination is made that there is no change in magnification when the acquired Xm (or Ym, Zm) agrees on the correlation function, and that there is a change in magnification when the acquired Xm (or Ym, Zm) does not agree on the correlation function. In 708, the deflection amount that agrees on the correlation function is calculated, and in 709, the calculated deflection amount is fed back to the deflector control system 46. Thereby, change in magnification is corrected.

Embodiment 5

A method for calculating change in intensity of an objective lens at the time of diagnosis, which is a fifth embodiment, can be brought into practice by replacing the variable Id of the correlation function with a setting value Io of the objective lens in FIG. 7.

Embodiment 6

Hereinafter, a sixth embodiment will be described. Similarly to the above-mentioned embodiment, the potential applied to the specimen is set to be sufficiently larger than the acceleration energy Ee of the electrons. Then, the primary electron beam 1 extracted by applying the extraction voltage 13 between the field emission electrode 11 and the extraction electrode 12 is accelerated in the condensing lens 14, and passes through the aperture 15. Then, the primary electron beam 1 is reflected above the specimen to become the mirror electron 3, and returns to the detector 29.

Figure 8:
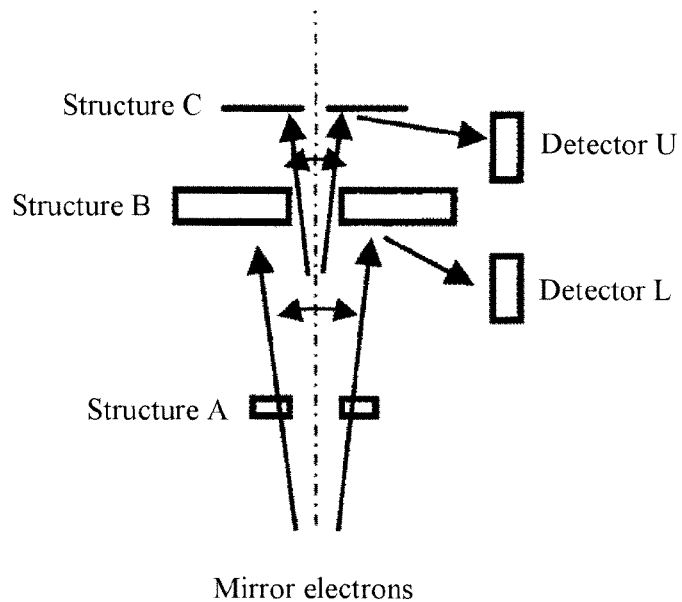
FIG. 8 is a diagram illustrating a method of calculating, based on an image of the mirror electrons, deviation of a position of a structure within the apparatus.
Figure 8:
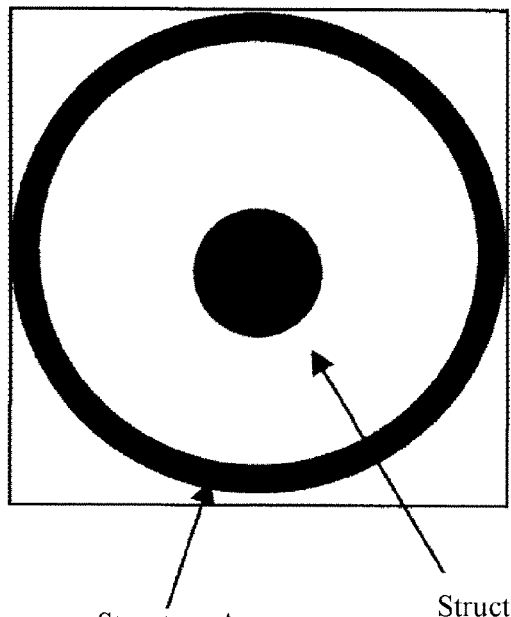
Figure 8:
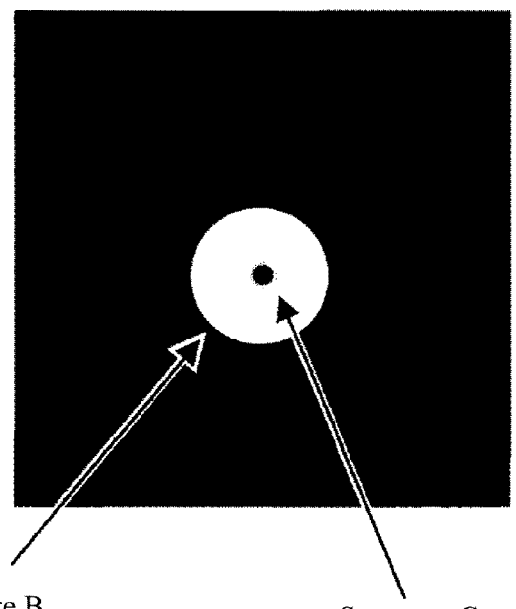

Here, when the mirror electron is scanned by the upper deflector 21 and the lower deflector 22, structures within the apparatus are irradiated with the mirror electron. Therefore, for example, when the detectors are disposed as a detector L and a detector U as shown in FIG. 8A, an image reflected from shapes of the structures can be acquired. In this case, from the image acquired by the detector L, the shape of the structure A, the shape of the structure B, and a positional relation therebetween can be calculated, as shown in FIG. 8B. From the image acquired by the detector U, the shape of the structure B, the shape of the structure C, and the positional relation therebetween can be calculated, as shown in FIG. 8C. Use of these images enables diagnosis of the machine difference between apparatuses, for example. Although the method can be accomplished also by using secondary electrons discharged from the specimen surface, the mirror electron has an energy width smaller than that of the secondary electron and can be formed into a fine flux. Therefore, use of the mirror electron enables clearer determination of the structure.

Use of the mirror electron allows the apparatus diagnosis within a column, with the mirror electron not being in contact with the specimen. Accordingly, it is possible to reduce correction of apparatus condition changes over time and the machine difference between the apparatuses by calculating an appropriate adjustment value from the diagnosis result.

Embodiment 7

Hereinafter, description will be given of an apparatus that measures the potential and the height of the specimen using the detection result of the mirror electron and that automatically corrects the apparatus conditions (magnification, focus, observation coordinate) that change due to specimen charge-up. The mirror electron is obtained in a state where the voltage is applied to the specimen being irradiated with a charged particle beam, in such a way that the charged particle beam fails to reach the specimen (hereinafter, this state may be referred to as the mirror state). Although the description below will be given, as an example, of a scanning electron microscope, which is an example of a charged particle beam apparatus, the present embodiment is also applicable, for example, to a focused ion beam apparatus which is other aspect of the charged particle beam apparatus. In this case, when the ion beam has positive charge, a positive voltage is applied to the specimen in order to form the above-mentioned mirror state. In addition, the detected charged particles are also cations.

First, a method for measuring the potential and the height of the specimen will be described. Under mirror conditions in which the primary electron beam does not enter the specimen, optical parameters (parameters related to lens magnification such as an object point ZC to the objective lens, an exciting current $I_{obj}$ of the objective lens, and the potential of the specimen $Vs=Vr+\Delta Vs$, and a boosting potential Vb) are respectively set to an arbitrary value. Then, to calculate the potential and the height of the specimen, direct or indirect measurement is performed on a beam arrival position $A_H(X_H, Y_H, Z_D)$ (arriving point of an H trajectory on the detector) depending on a beam divergence angle on an object surface, a beam arrival position $A_G(X_G, Y_G, Z_D)$ (arriving point of a G trajectory on the detector) depending on a beam position on the object surface, or both of $A_H$ and $A_G$. A method for deriving the arrival position of the mirror electron will be shown below.

Any electron detector can be selected as a detector for mirror electron, from among a detector that directly detects the mirror electron, such as MCP, a detector that causes the mirror electron to collide with a reflector or the like and detects the discharged secondary electrons, and other electron detectors. However, it is desirable to use a detector having multiple detecting elements two-dimensionally spread. Moreover, the arrival position of the mirror electron may be determined using elements obtained by adhering a fluorescent screen to a light sensing portion of a CCD (Charge Coupled Device).

It is possible to calculate the arrival position or distribution of the mirror electrons from output signals of these several detecting elements, and to calculate deviation from a reference value as a characteristic quantity. Moreover, use of images enables easier detection of the characteristic quantity. When a mirror electron is reflected right above the specimen and passes through the inside of the lens system, the mirror electron is influenced by a path of the beam, or the structure. In order to acquire the image, a position of an incident beam may be scanned. Thereby, the shape of the structure in the beam path is formed as an image. The characteristic quantity Fm can be measured by measuring a dimension of the shape of the structure transferred into the image, and sags of an edge.

Relationships (F1 (Vs, Zs), F2 (Vs, Zs), . . . ) among the characteristic quantity, the potential of the specimen, and the height of the specimen under multiple optical conditions (optical condition 1, optical condition 2, . . . . ) are stored in advance as functions or as values calculated by simulation or actual measurement, and are referred to at the time of measurement. Then, the potential and the height of the specimen can be derived from the characteristic quantities (Fm1, Fm2 . . . ) acquired under the multiple optical conditions.

Here, an example of a method for deriving the height and the potential of the specimen will be described, using a case where optical parameters (optical condition 1, optical condition 2) other than the potential Vs and the height Zs of the specimen are set, and the characteristic quantities (Fm1, Fm2) are acquired.

Figure 10:
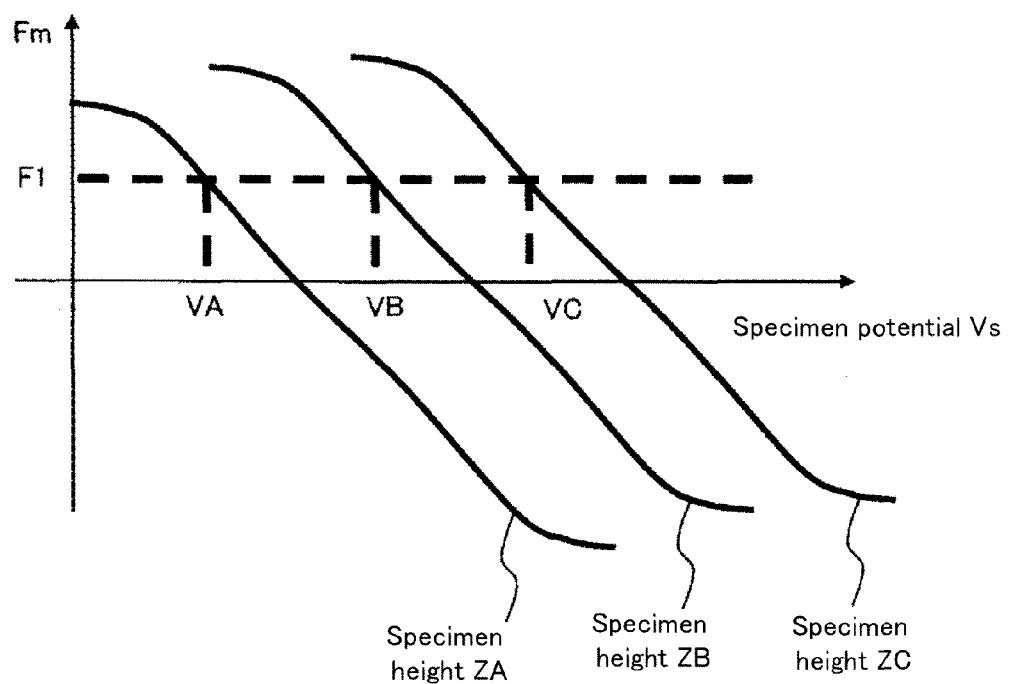
FIG. 10 is a diagram illustrating a relationship among a characteristic quantity extracted from a detection result of the mirror electrons, the potential of the specimen, and the height of the specimen.
Figure 11:
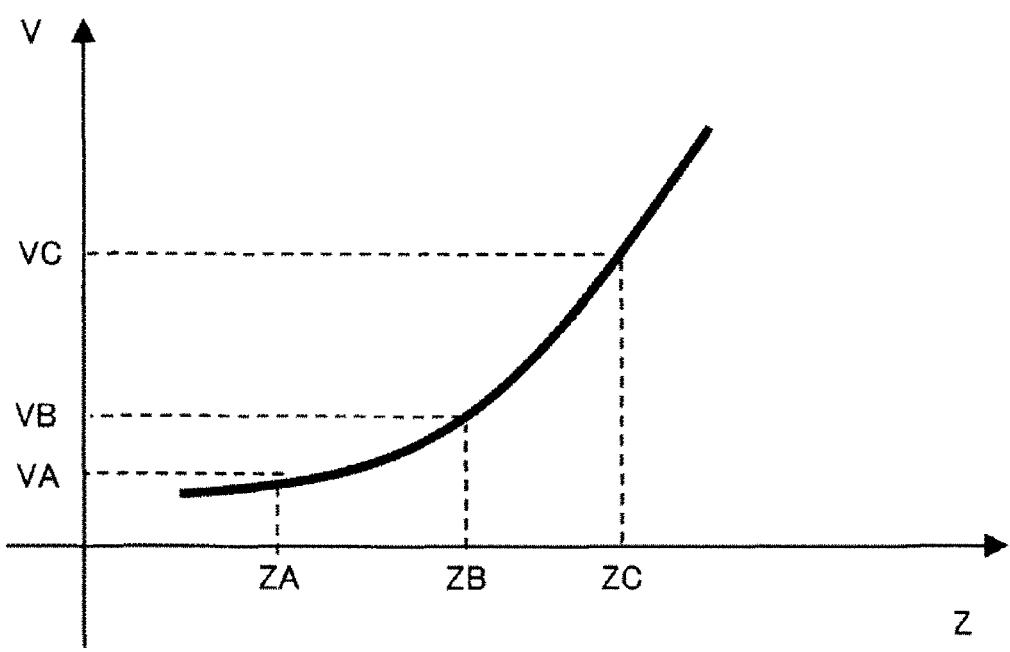
FIG. 11 is a diagram showing a relationship between the potential and the height of the specimen when the characteristic quantity extracted from the detection result of the mirror electrons takes a specific value.

The relationship among the acquired characteristic quantity Fm, the potential Vs of the specimen, and the height Zs of the specimen is shown in FIG. 10. The characteristic quantity Fm varies depending on the potential Vs and the height Zs of the specimen. First, description will be given of a case where the optical condition 1 is set and the acquired characteristic quantity is Fm1. When the characteristic quantity is Fm1 (dotted line in the drawing), the derived potential varies depending on the height of the specimen. For example, when the height of the specimen is ZA (ZB, ZC), the measured potential is VA (VB, VC). A relationship between the height and the potential of the specimen at this time (on the dotted line) is shown in FIG. 11. In this way, the height Zs and the potential Vs of the specimen depend on each other. Therefore, when one of Zs and Vs is found, the other can be also found. Furthermore, when another optical condition (optical condition 2) is set and the characteristic quantity is thus acquired, both of the height Zs and the potential Vs of the specimen can be measured.

Figure 12:
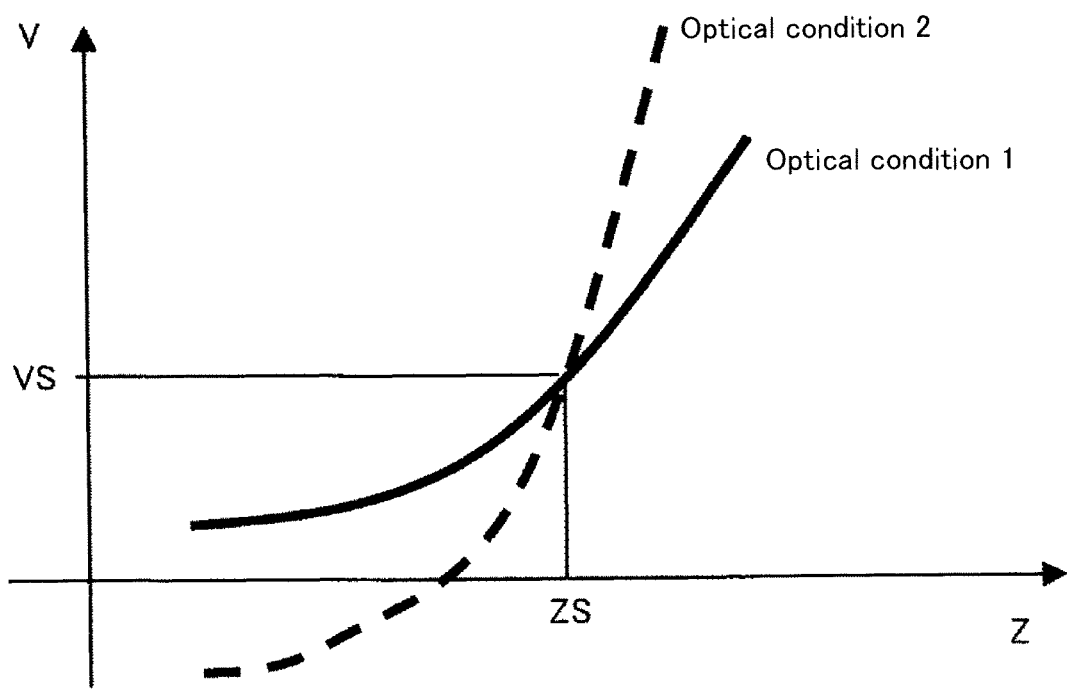
FIG. 12 is a diagram illustrating a method of deriving the potential and the height of the specimen from the multiple characteristic quantities.

A method for measuring the height Zs and the potential of the specimen will be described, using, as an example, a case where the characteristic quantity acquired under the optical condition 1 (optical condition 2) is F1 (F2). FIG. 12 shows an explanatory view of a method of measurement. A solid line (dotted line) shows the relationship between the height Zs and the potential Vs of the specimen when the characteristic quantity acquired under the optical condition 1 (optical condition 2) is F1 (F2). Two curves intersect at this time. When calculating this point of intersection, the potential and the height of the specimen can be derived.

Here, the method for calculating an individual curve that shows the relationship between the potential Vs and the height Zs of the specimen for each optical condition, and calculating the potential and the height of the specimen from the calculated curve is shown. However, F1 (Vs, Zs) and F2 (Vs, Zs) may be represented by a certain function and the height Zs and the potential Vs of the specimen may be thus calculated by directly solving an equation. Alternatively, the characteristic quantity Fm may be created into a table using the height Zs and the potential Vs of the specimen, and the height Zs and the potential Vs of the specimen may be calculated by interpolation or fitting by use of points that exist adjacent to the acquired characteristic quantity Fm.

When the functions F1 (Vs, Zs) and F2 (Vs, Zs) have a higher order component, the functions have multiple solutions. However, by limiting a range in which these solutions exist, or increasing the number of the characteristic quantities acquired under different optical conditions, measurement of the potential and the height of the specimen can be performed with stability.

Moreover, a setting width of the optical conditions in the mirror mode can be expanded by installing structures for determining the characteristic quantity above and under the deflector. Although a method for calculating the height Zs and the potential of the specimen using a dimension of a shadow (projection image) of a first structure and a dimension of a shadow of a second structure will be shown here, the method can be also applied to other characteristic quantity.

When an upper detector 922 detects the mirror electrons, an on-screen length L1 of the shadow of the first structure is determined by the magnification $M_{obj}$ of the objective lens, and can be represented by the following formula:

$$\vec{l}_1 = M_{obj} \begin{pmatrix} Xo \\ Yo \end{pmatrix} \quad (1)$$

$$1/L1 = |\vec{l}|$$

where $X_O, Y_O$: deflection amount on the object surface, $X_O = C1\ X_{DEF}, Y_O = C1\ Y_{DEF}$ $X_{DEF}, Y_{DEF}$: deflection amount of the deflector and the inverse of the length L1 of the shadow of the first structure is proportional to the magnification $M_{obj}$ that varies depending on the potential and the height of the specimen, and other optical parameters.

Next, a length L2 of a shadow of the second structure varies depending on the magnification of the objective lens and the deflection amount of the deflector, as shown in the following formula:

$$\vec{l}_2 = M_{obj} \begin{pmatrix} Xo \\ Yo \end{pmatrix} + \begin{pmatrix} X_{DEF} \\ Y_{DEF} \end{pmatrix} \quad (2)$$

$$1/L2 = |\vec{l}_2|$$

Accordingly, when a ratio (L1/L2) of the length L1 of the shadow of the first structure to the length L2 of the shadow of the second structure is extracted as the characteristic quantity, a magnitude of the characteristic quantity can be varied to a desired deflection amount, independent of the deflection amount of the deflector. For this reason, the setting width of the optical conditions in the mirror mode can be expanded.

Moreover, the potential and the height of the specimen are derived from the characteristic quantity obtained from the mirror electrons, and appropriate values suitable for observation conditions are inputted into the optical parameters, such as a holder potential Vr, an exciting current $I_{obj}$ of the objective lens, energy E of a primary beam, and an observing magnification. Thereby, a clear SEM image with high magnification accuracy can be obtained, without irradiating the specimen with the beam before observation.

In the scanning electron microscope according to the present embodiment, two types of optical modes can be set: an optical mode for observation and an optical condition (mirror mode) of the mirror mode in which the potential of the specimen is set in a way that the primary electron beam cannot reach the specimen. Before performing normal SEM image observation, the optical condition is set to the mirror mode. Moreover, on the basis of the detection result of the mirror electrons obtained in the mirror mode, the potential and the height of the specimen are measured, and the optical parameters in the optical mode for SEM image observation, such as the amount $I_{obj}$ of excitation of an objective lens 912 and the potential Vr of the specimen holder, are set from the measured result. Consequently, without irradiating, with the electron beam before observation, the specimen whose charge-up and height are unknown before observation of the SEM image, a clear SEM image having higher magnification accuracy can be acquired also for the specimen. Hereinafter, detailed description will be given using the drawings.

Figure 9:
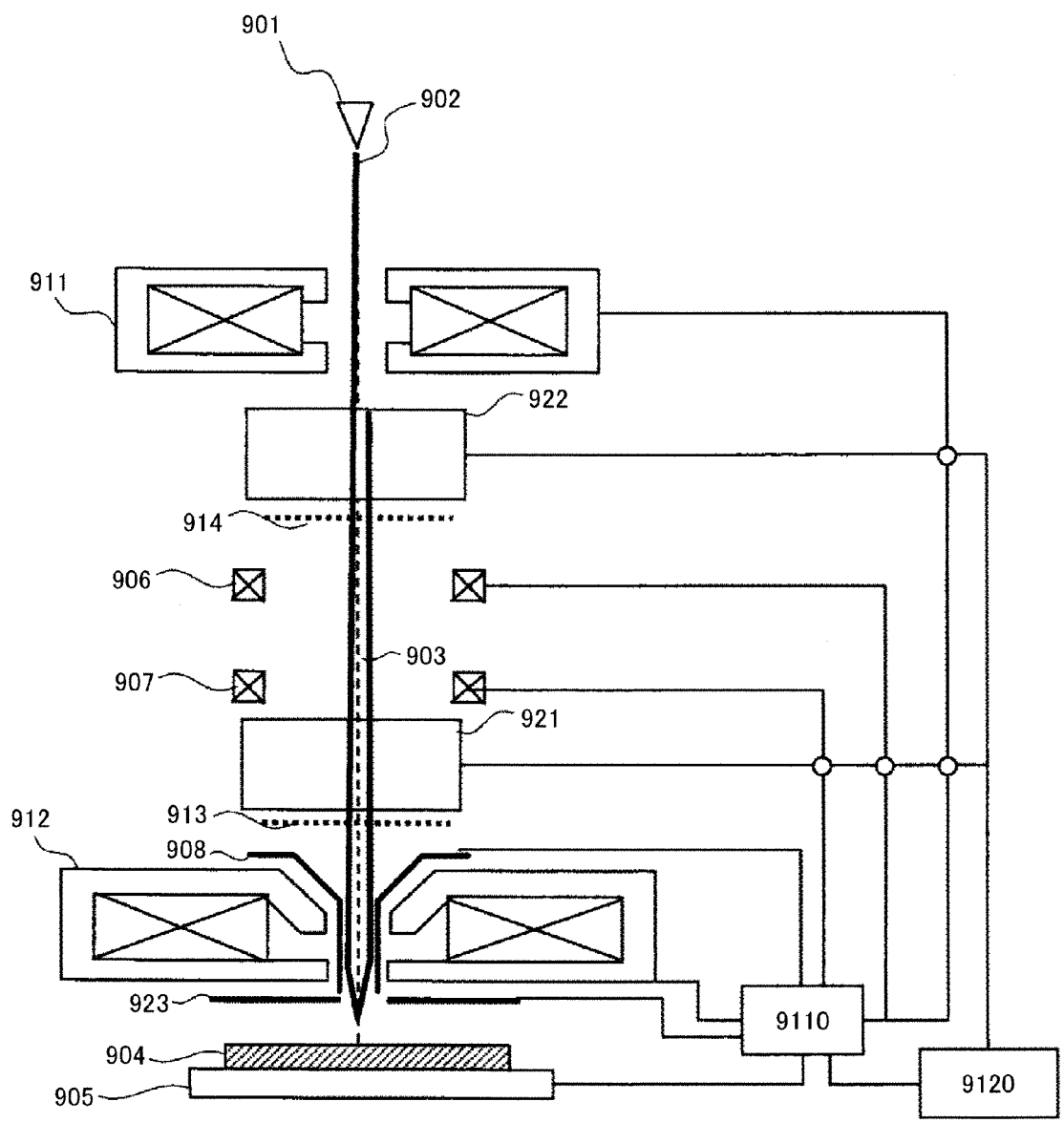
FIG. 9 is a schematic configuration diagram of a scanning electron microscope.

FIG. 9 shows an apparatus configuration of the SEM. The potential of a specimen holder 905 is set to a value which prevents the primary electron beam from reaching a specimen 904, and the optical condition is set to the mirror mode. In a case where arrival energy of the electron beam to the specimen is 2000 eV, for example, in a state where no voltage is applied to the specimen 904, or the specimen holder 905 (may be referred to as a specimen stand) (that is, a state where the specimen has an earth potential (except the case where charge-up is adhered)), when the voltage applied to the specimen is larger than 2 kV, the electron beam fails to reach the specimen, and is reflected by a potential barrier right in front of the specimen. Such a state is referred to as a mirror state, and to provide the mirror state by an adjustment of the optical conditions of the electron microscope (an acceleration voltage, the voltage applied to the specimen, and the like) is referred to as a mirror mode.

Behavior of the primary electrons in the mirror mode will be shown below. A primary electron beam 902 is extracted from a field emission electrode 901. The extracted primary electron beam 902 is accelerated by an accelerating electrode not shown. For example, a voltage Vacc is applied to the accelerating electrode.

The primary electron beam 902 is focused by a condensing lens 911 and subjected to scanning deflection by an upper deflector 906 and a lower deflector 907. The deflected primary electron beam 902 is further accelerated by a boosting electrode 908 provided in a path of the objective lens 912. The accelerated primary electron beam is decelerated under the influence of an electric field formed due to a potential difference between an electric field control electrode 923 and the specimen 904, and the resultant primary electron beam is reflected right above the specimen. The reflected primary electron beam 903 travels backward within a mirror body. By setting the voltage Vr applied to the specimen to be larger than the above-mentioned Vacc, the electron beam is reflected in a direction reverse to an electron beam irradiation direction without reaching the specimen.

The primary electron beam that has traveled backward is accelerated by the boosting electrode 908, and passes through a first structure 913 and rushes into the lower detector 921. When the lower detector 921 is turned OFF, the primary electron beam continues travelling backward, is subjected to deflection action by the deflector, passes through a second structure, and is detected by the upper detector 922. The detected signal is inputted into a specimen information computing device 9120, and the potential Vs and the height Zs of the specimen are derived. Then, the calculated potential Vs and height Zs of the specimen are inputted into an optical condition control device 9110. In the optical condition control device 9110, a voltage and exciting current appropriate for an exiting coil and an electrode, such as the electric field control electrode, the boosting electrode, an electrode which determines optical properties of the objective lens, the condensing lens, the upper deflector, the lower deflector and the like, are set in a way that focusing is made above the observed specimen based on the inputted potential and height of the specimen and the observation conditions. Thereby, an SEM image is acquired.

Here, an example is shown when the mirror electron is detected by the upper detector and the height and the potential of the specimen are calculated in the specimen information computing device 9120. However, detection of the mirror electrons by the lower detector 921 is advantageous in that the mirror electron is not influenced by the upper deflector 906 and the lower deflector 907 at the time of a return trip. Without deviating from the spirit of the invention, the present embodiment can be applied to cases where the first detector detects the characteristic quantity, where only the second detector detects the characteristic quantity, where the characteristic quantity detected by the first and second detectors are used, and the like.

Figure 13:
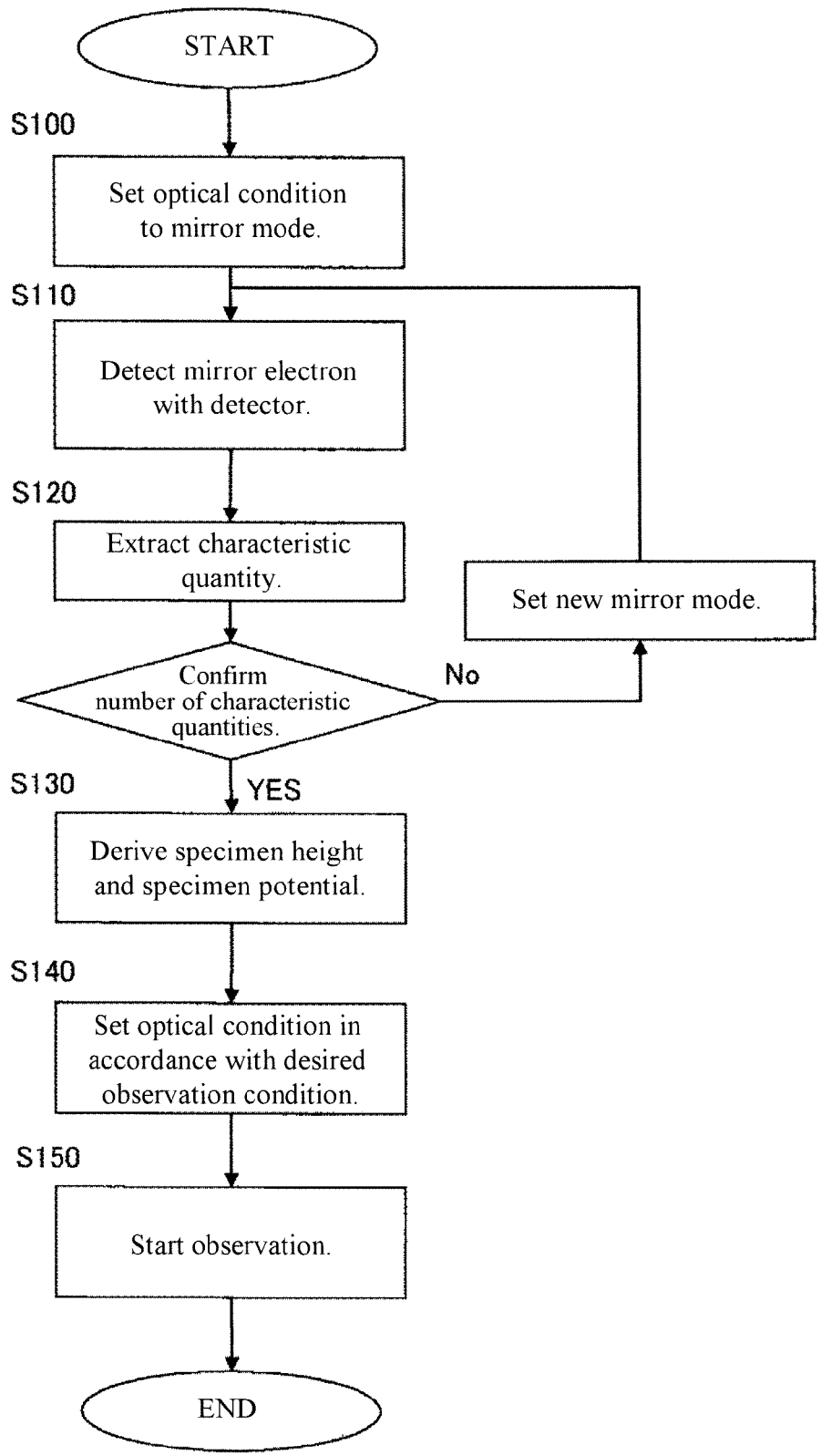
FIG. 13 is a diagram illustrating a seventh embodiment and a tenth embodiment.
Figure 16:
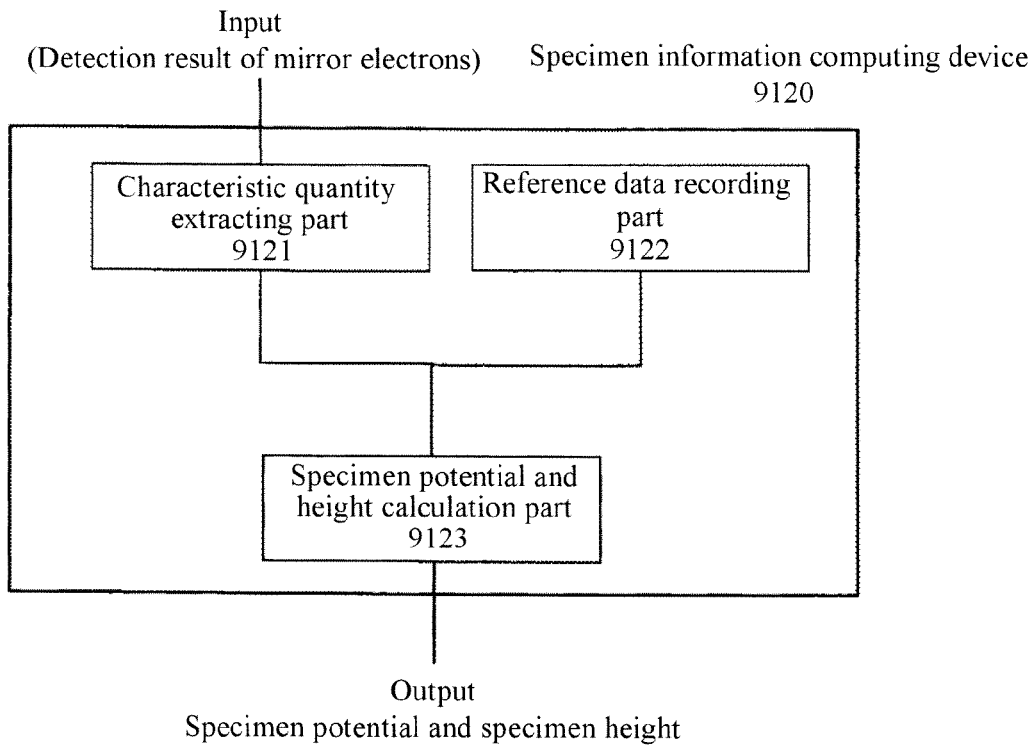
FIG. 16 is a diagram illustrating a specimen information computing device.

Next, a seventh embodiment will be described using a flowchart in FIG. 13. In the present embodiment, description will be given of an electron microscope having a reference data recording unit 9122 that records a function Fm (Zs, Vs) showing a relationship among the height of the specimen, and the potential of the specimen, and the characteristic quantity extracted from the detection result of the mirror electrons, or that records a table of the characteristic quantity (see FIG. 16).

In Step 100, the optical condition is set to the mirror mode. In Step 110, the mirror electron is detected, and the detection result is inputted into the specimen information computing device 9120. In Step 120, the characteristic quantity is extracted by a characteristic quantity extracting part 9121 from the inputted detection result of the mirror electrons. In Step 130, a specimen potential and height calculation part 9123 derives the height and the potential of the specimen from the extracted characteristic quantity and the table of the characteristic quantity or the function Fm (Zs, Vs) showing the relationship among the characteristic quantity, the height of the specimen, and the potential of the specimen, the function or the table being recorded in advance for each optical condition of the mirror mode in the reference data recording unit 9122.

Figure 17:
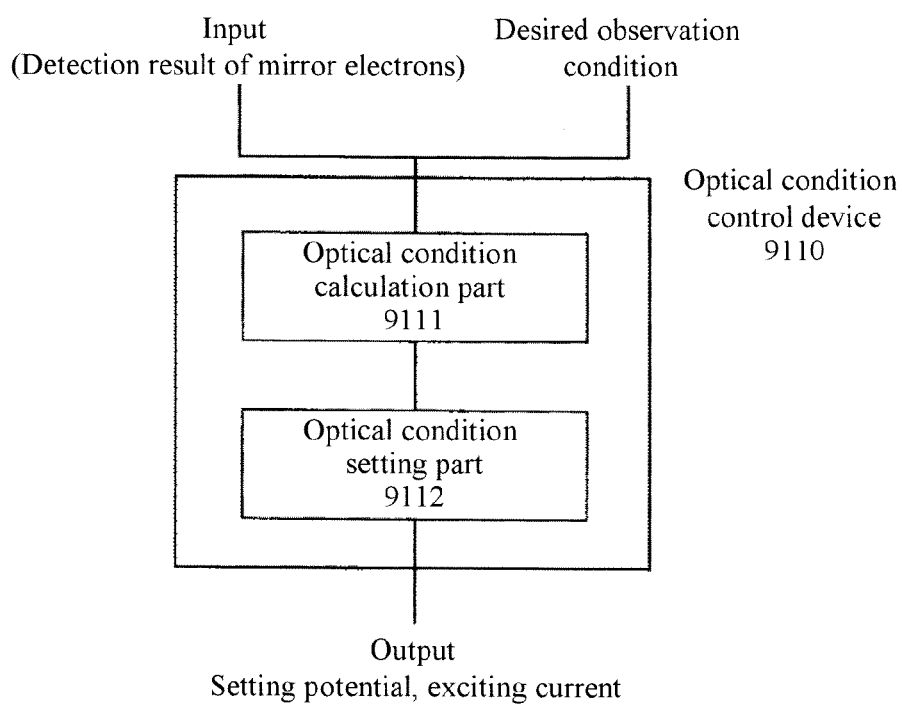
FIG. 17 is a diagram illustrating an optical condition control device.

In Step 140, the derived height Zs and potential Vs of the specimen, and a desired observation condition are inputted into an optical condition calculation part 9111 illustrated in FIG. 17. Based on the inputted parameters, calculation is made on the optical parameters (potential of each electrode, amount of excitation of each exiting coil, deflection amount of the deflector, observation magnification, and the like) which cause the electron beam to focus above the specimen. The calculated optical parameters are inputted into the optical condition setting part 9112, and the potential and exciting current for each electrode and the exciting coil are thus set respectively.

The above-mentioned characteristic quantity denotes the detected position of the electron on the detector, the dimension of the structure on the image, the position of the structure, sags of the edge, the amount of rotation, luminance, and the like. All of them can be detected using existing techniques. For example, the dimension of the structure is detected based on the magnification of the electron microscope, an occupation percentage of the structure on the image, and the like; the position of the structure based on general image processing techniques for identifying the position of the structure on the image; sagging of the edge based on a sharp evaluation that is used for a focus adjustment, and the like; the amount of rotation, about degrees of rotation of the target structure on the image, based on general image processing techniques; and the luminance based on luminance histogram formation of the image.

Embodiment 8

Figure 14:
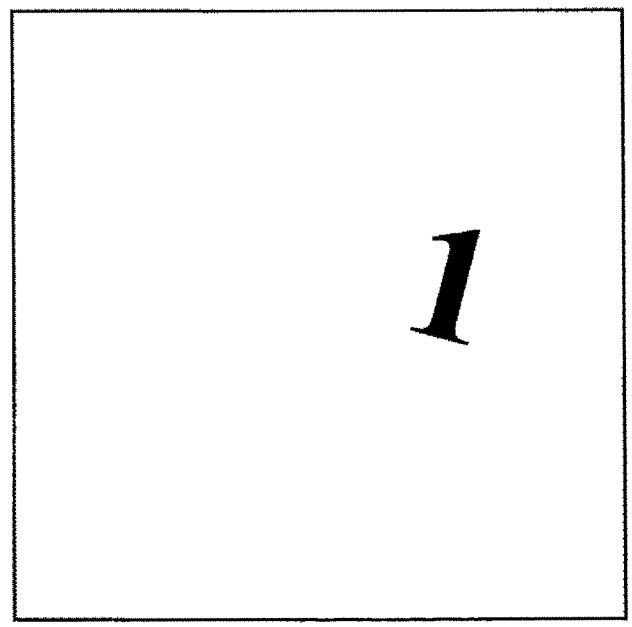
FIG. 14 is a diagram illustrating an eighth embodiment.

A method for deriving the height and the potential of the specimen using the characteristic quantity extracted from the shadow of the structure will be shown as an eighth embodiment. The present embodiment shows a case where the structure in a shape of 1 is installed in the position of the first structure 913, and the mirror electron is detected by the upper detector 922 while the electron beam is scanned by the upper deflector 906 and the lower deflector 907. Alternatively, the positional relation of the detectors or the structures may be changed. At this time, as shown in FIG. 14, the image having characteristics depending on the shape of the structure is obtained from the detection result of the mirror electron. The dimension of the structure, sags of the edge, the amount of rotation, and the luminance thus obtained are converted into numbers as the characteristic quantity, and the height and the potential of the specimen are derived.

Embodiment 9

Figure 15:
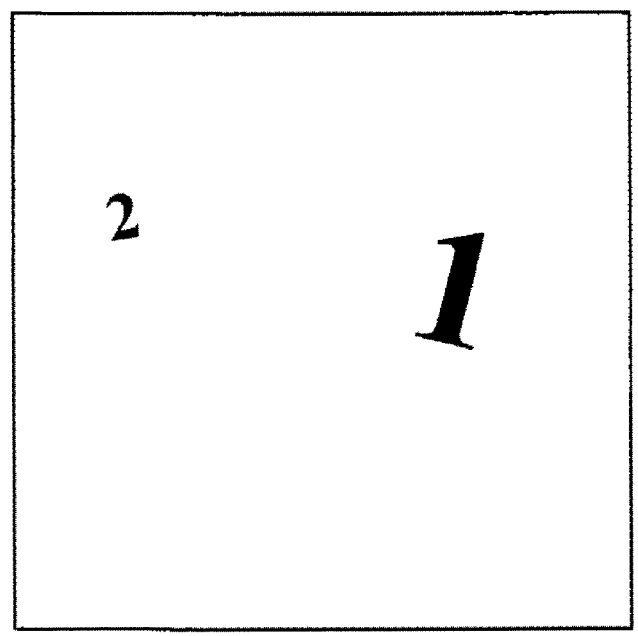
FIG. 15 is a diagram illustrating a ninth embodiment.

As a ninth embodiment, an electron microscope will be shown, in which a structure installed on mirror electron trajectory is installed both above and below a deflector, and based on a ratio or difference of the characteristic quantities extracted from the shadows of the structures installed above and below the deflector, the potential and the height of the specimen are measured. A first structure 913 in a shape of 1 is installed below the deflector, and the second structure 914 in a shape of "2" is installed above the deflector. While the electron beam is scanned by the upper deflector 906 and the lower deflector 907, the mirror electron is detected by the upper detector 922. Thereby, the image as shown in FIG. 15 can be acquired. When a ratio of the dimension of the first structure and the dimension of the second structure, which are displayed on the image, is extracted as the characteristic quantity at this time, there is an advantage in that a magnitude of the characteristic quantity is not dependent on the exciting current of a deflecting coil. While the ratio of the dimension of the first structure and the dimension of the second structure is used as the characteristic quantity here, values relating to sagging of the edge, the amount of rotation, and the luminance may be extracted as the characteristic quantity.

Embodiment 10

As a tenth embodiment, an electron microscope that measures the height and the potential of the specimen from the characteristic quantities acquired under the optical condition in multiple mirror modes will be shown. If the number of the characteristic quantities has not reached yet the desired number at the time of checking the number of the characteristic quantities at Step 160 in the flowchart shown in FIG. 13, the electron microscope sets the optical condition to a new mirror mode, and extracts a new characteristic quantity in Step 170.

Additionally, in Step 120, two or more characteristic quantities, for example, sags of the edge and the dimension of the structure, a beam diameter on a detecting surface and a deflecting width, or the like, may be extracted from the detection result of the mirror electron under a single optical condition.

Embodiment 11

As an eleventh embodiment, an electron microscope that holds a calibration specimen on the specimen holder will be shown. This calibration specimen is used to ensure an absolute value of the potential or focus conditions. It is desirable that the calibration specimen should be a conductor, located approximately at the same height as the observed specimen, and grounded to the specimen holder so as to have the same potential as that of the specimen holder. When a reference data is acquired in advance from the calibration specimen, an error of measurement generated by changes of the optical conditions over time can be reduced.

Moreover, use of materials, such as Au whose changes over time are small and whose work function is known, is advantageous in that an absolute value of a specimen surface can be ensured.

Embodiment 12

In a twelfth embodiment, an electron microscope that holds, on a wafer holder, a calibration specimen for adjusting changes of the optical condition over time and updates a measured value or function stored in the reference data recording unit 9122 will be shown.

Figure 18:
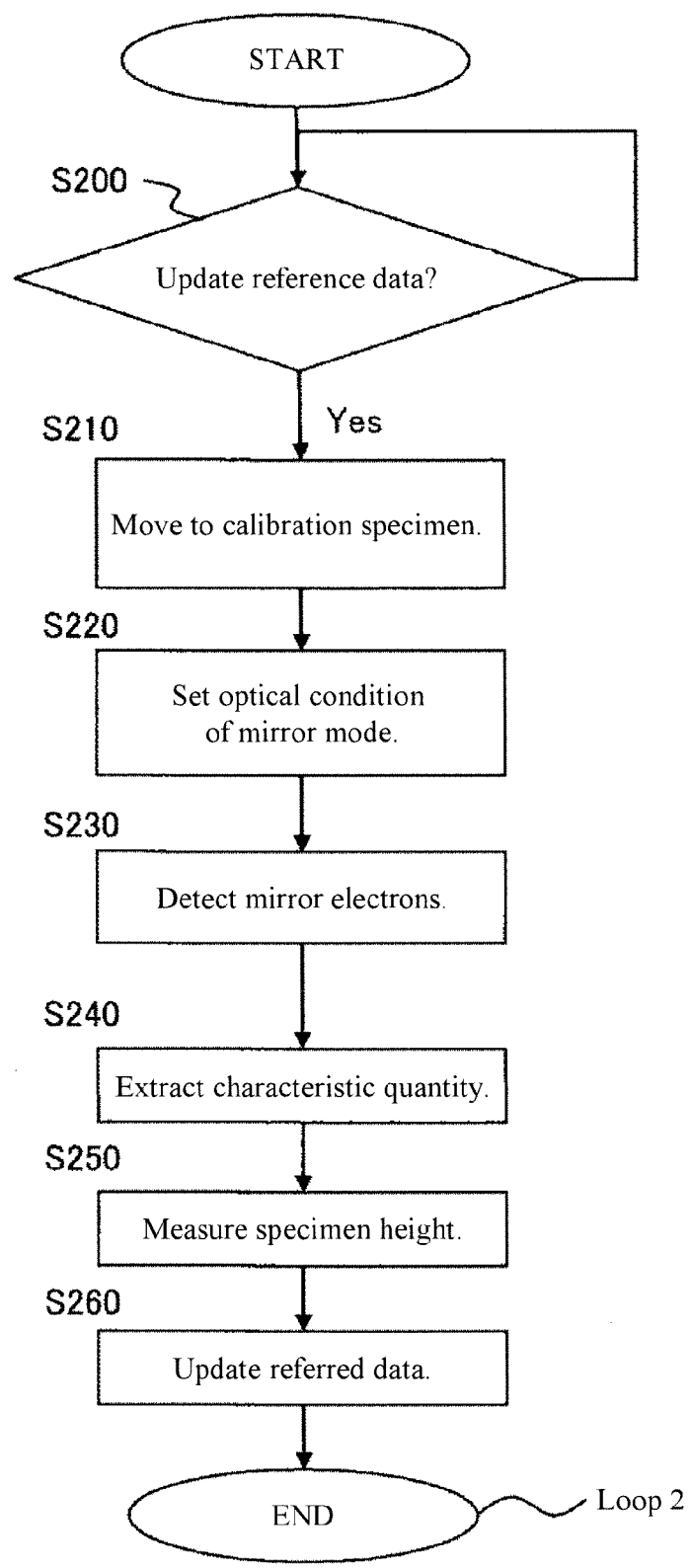
FIG. 18 is a diagram illustrating a twelfth embodiment.

FIG. 18 shows a flowchart of the twelfth embodiment. Determination is made as to whether reference data is updated in Step 200. The reference data may be periodically updated, or may be automatically updated when focus deviation at the time of observation becomes remarkable. In Step 210, the measurement target is changed to a calibration specimen for reference data. In Step 220, the mirror mode in which the reference data is updated is set. In Step 230 and Step 240, the mirror electron is detected and the characteristic quantity is extracted. In Step 250, the height of the calibration specimen is measured from a Z sensor, an exciting current of normal SEM observation, and multiple characteristic quantities extracted in the mirror mode.

In Step 260, the relationship among the height of the specimen, the potential of the specimen, and the characteristic quantity obtained from Step 210 to Step 250 is stored in the reference data recording unit 9122.

Moreover, using a calibration specimen having multiple heights, the reference data is acquired under each of the optical conditions of multiple heights and in multiple mirror modes. Thereby, even when changes over time are generated in the optical condition in the mirror mode, the height and the potential of the specimen can be accurately measured. Additionally, before SEM image observation, the optical conditions such as focus, magnification, and observation position, can be adjusted without irradiating the specimen with the electron beam.

What is claimed is:

1. A scanning electron microscope, comprising:
an electron source;
a lens that focuses an electron beam emitted from the electron source;
a power source that applies to a specimen a negative voltage that decelerates the electron beam;
a control device that controls the negative voltage; and
a detector that detects an electron, wherein:
the detector detects an electron that is reflected without reaching the specimen by an electric field formed by the negative voltage applied to the specimen, and
the control device corrects a signal value to be supplied to the lens based on a difference between an output of the detector when a predetermined signal is supplied to the lens and a pre-stored output of the detector when the predetermined signal is supplied to the lens.

2. The scanning electron microscope according to claim 1, wherein the control device:
calculates a correlation between the output of the detector when the predetermined signal is supplied to the lens and a signal value thereof, and
calculates a misalignment of the electron source based on a difference between the correlation and a pre-stored correlation between the output of the detector when the predetermined signal is supplied to the lens and the signal value thereof.

3. The scanning electron microscope according to claim 2, wherein the control device stores a plurality of correlations for a respective plurality of signals supplied to the lens.

4. A scanning electron microscope, comprising:
an electron source;
a scanning deflector that scans across a specimen an electron beam emitted from the electron source;
a power source that applies to the specimen a negative voltage that decelerates the electron beam;
a control device that controls the negative voltage; and
a detector that detects an electron, wherein:
the detector detects an electron that is reflected without reaching the specimen by an electric field formed by the negative voltage applied to the specimen, and
the control device corrects a signal value to be supplied to the scanning deflector based on a difference between a detected position of the electron that is detected when the electron beam is scanned and a pre-stored detected position of the electron that is detected when a predetermined signal is supplied to the scanning deflector.

5. The scanning electron microscope according to claim 4, wherein the control device:
calculates a correlation between the detected position of the electron that is detected when the electron beam is scanned and a signal value that is supplied to the scanning deflector at the time of the scanning, and
calculates a magnification variation based on a difference between the correlation and a pre-stored correlation between the detected position of the electron that is detected when the predetermined signal is supplied to the scanning deflector and the signal value thereof.

6. The scanning electron microscope according to claim 5, wherein the control device varies the signal to be supplied to the scanning deflector in accordance with the calculated magnification variation.

* * * * *